(12) United States Patent
Lee

(10) Patent No.: US 7,938,976 B2
(45) Date of Patent: May 10, 2011

(54) METHOD OF REMOVING GRAPHITIC AND/OR FLUORINATED ORGANIC LAYERS FROM THE SURFACE OF A CHIP PASSIVATION LAYER HAVING SI-CONTAINING COMPOUNDS

(75) Inventor: Kang-Wook Lee, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 621 days.

(21) Appl. No.: 11/679,247

(22) Filed: Feb. 27, 2007

(65) Prior Publication Data

US 2008/0207002 A1     Aug. 28, 2008

(51) Int. Cl.
*C23F 1/00* (2006.01)
*H01L 21/302* (2006.01)

(52) U.S. Cl. ............... 216/67; 216/58; 216/64; 134/1.1; 134/1.2; 134/1.3; 438/710

(58) Field of Classification Search .................... 216/67; 438/710; 257/E21.214
See application file for complete search history.

(56) References Cited

U.S. PATENT DOCUMENTS

| 6,605,480 | B2 * | 8/2003 | Liu et al. ......................... 438/14 |
| 6,649,531 | B2 * | 11/2003 | Cote et al. ..................... 438/714 |
| 2002/0162736 | A1 * | 11/2002 | Ngo et al. ................. 204/192.12 |
| 2004/0219797 | A1 * | 11/2004 | Honda et al. .................. 438/709 |
| 2005/0161834 | A1 * | 7/2005 | Cowens et al. ............... 257/778 |
| 2009/0137129 | A1 * | 5/2009 | Kojima et al. ................ 438/725 |

* cited by examiner

*Primary Examiner* — Nadine G Norton
*Assistant Examiner* — Patti Lin
(74) *Attorney, Agent, or Firm* — Scully, Scott, Murphy & Presser, P.C.; Daniel P. Morris, Esq.

(57) ABSTRACT

A method for removing undesirable contaminants from a chip passivation layer surface without creating $SiO_2$ particles on the passivation layer, wherein the undesirable contaminants include graphitic layers and fluorinated layers. The use of $N_2$ plasma with optimized plasma parameters can remove through etching both the graphitic and fluorinated organic layers. The best condition for the $N_2$ plasma treatment is to use a relatively low-power within the range of 100-200 W and a relatively high vacuum pressure of $N_2$ in the range of 500-750 mTorr.

1 Claim, 2 Drawing Sheets

BINDING ENERGY (eV)

METHOD OF REMOVING GRAPHITIC AND/OR FLUORINATED ORGANIC LAYERS FROM THE SURFACE OF A CHIP PASSIVATION LAYER HAVING SI-CONTAINING COMPOUNDS

BACKGROUND OF THE INVENTION

1. Field of the Invention

The present invention pertains to the provision of reliable flip chip plastic or organic semiconductor packages, and to a method of producing the packages. More specifically, the present invention is directed to the removal of graphitic and/or fluorinated organic layers from a semiconductor chip passivation layer surface in the instance that a chip passivation layer includes Si-containing materials, whereby the treated chip is employed to make a flip chip plastic package, providing for an increase in the yield or output thereof.

The surface of an advanced semiconductor chip is typically provided with solder balls and a passivation layer. Generally, the passivation layer may be constituted of silicon nitride, a polyimide, a photosensitive polyimide, or of a benzocyclobutane polymer, whereas the solder balls may consist of a Pb and Sn alloy or a Pb-free alloy, whereby the major metallic component of the latter is tin (Sn). The most recently employed semiconductor chips have a tendency to be equipped with Pb-free solder balls in order to protect the environment. In the process of producing the Pb-free solder balls, the surface of a polymer passivation layer, which is provided, includes a graphitic organic layer and/or a fluorinated organic layer.

In a process of manufacturing flip chip plastic ball grid array (FC-PBGA), a chip is placed onto and electrically connected with a laminate, in which flux is employed in the flip chip-joining step, and the subsequently formed residue is ordinarily cleaned with DI water. However, a graphitic layer and/or a fluorinated layer, which is present on the surface of a chip passivation layer, render the post-chip joint cleaning process difficult to implement, whereby a certain level of organotin residue, which is formed during chip joining process remains in an uncleaned condition.

The gap, which remains between a chip and a laminate in an FC-PBGA package, is filled with an underfill material in order to reinforce the mechanical and electrical strength and operational integrity of the FC-PBGA package. The underfill-chip interface evidences a tendency to delaminate in the presence of some level of organotin residue. In that instance, the delamination frequently leads to an extrusion of solder so as to form a tin bridge between adjacent solder balls, thereby resulting in electrical shorts. In addition thereto, the presence of a graphitic layer on a chip passivation layer can also cause electrical shorts, inasmuch as it is electrically conductive in nature.

2. Discussion of the Prior Art

In view of the above-mentioned difficulties, it, thus, becomes necessary to remove the graphitic layer and/or fluorinated polymer layer in order to be able to obtain a clean polymer passivation layer surface, whereby the resultant clean passivation layer surface provides a reliable FC-PBGA electronic package. Oxygen ($O_2$) plasma can readily remove a graphitic and/or fluorinated organic layer. However, $O_2$ plasma processes create $SiO_2$ particles on a photosensitive polyimide (PSPI) and a poly (benzocyclobutane-siloxane) (BCB) since they contain silane compounds. It is well known that $O_2$ plasma on a polymer with silane organic compounds cumulates $SiO_2$ particles on the polymer surface since the plasma forms $SiO_2$ while the polymer is etched. The use of a $N_2$ and $H_2$ mixture gas tends to leave some graphitic layers since $H_2$ plasma reduces organic molecules.

SUMMARY OF THE INVENTION

Accordingly, there is a need in the technology to be able to remove a graphitic organic layer and/or a fluorinated organic layer without creating $SiO_2$ particles.

Pursuant to the invention, there is provided a simple technique for removing undesirable contaminants from the surface of a chip passivation layer, wherein such undesirable contaminants may include graphitic layers and fluorinated organic layers, and which the chip passivation layer can consist of polyimide, PSPI, BCB, and the like.

In connection with the foregoing, $N_2$ plasma can remove graphitic and/or fluorinated layers without creating $SiO_2$ particles or SnOx/organotin on PSPI or BCB. A combination of a high-power and a low-pressure re-deposits Sn/SnOx/organotin onto the polymer surface. The best condition for an $N_2$ plasma is to employ a low-power (100-200 W) and a high-pressure (500-750 mTorr). A wafer is treated with $N_2$ plasma to eliminate graphitic and/or fluorinated layers, and then followed by a typical process to prepare chips.

BRIEF DESCRIPTION OF THE DRAWINGS

FIG. 2a illustrates a high-resolution C1s spectrum corresponding to FIG. 1a.

DETAILED DESCRIPTION OF THE INVENTION

Figure 1A:
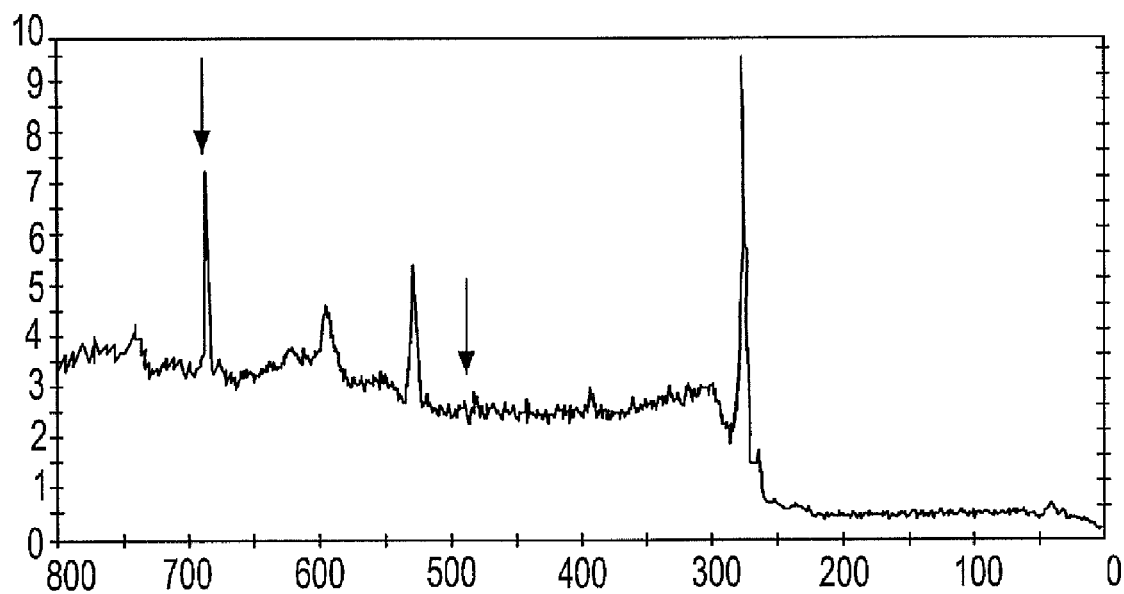
FIG. 1a illustrates an XPS spectrum on the surface of a chip passivation layer that includes both graphitic and fluorinated layers.
Figure 2A:
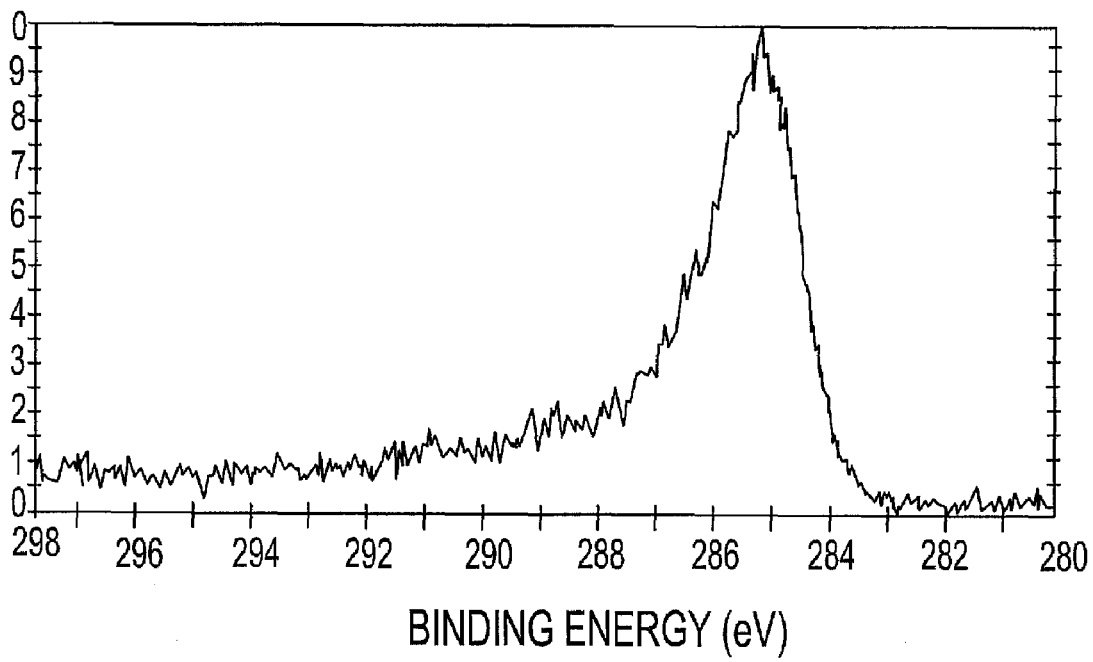

As shown in FIG. 1a, the XPS spectrum of a semiconductor chip prior to the treatment with $N_2$ plasma, which evidences a considerable amount of F and graphitic layers. FIG. 2a shows a high-resolution spectrum of C1s XPS that demonstrates a typical graphitic layer, which has been formed on polyimide.

Figure 1B:
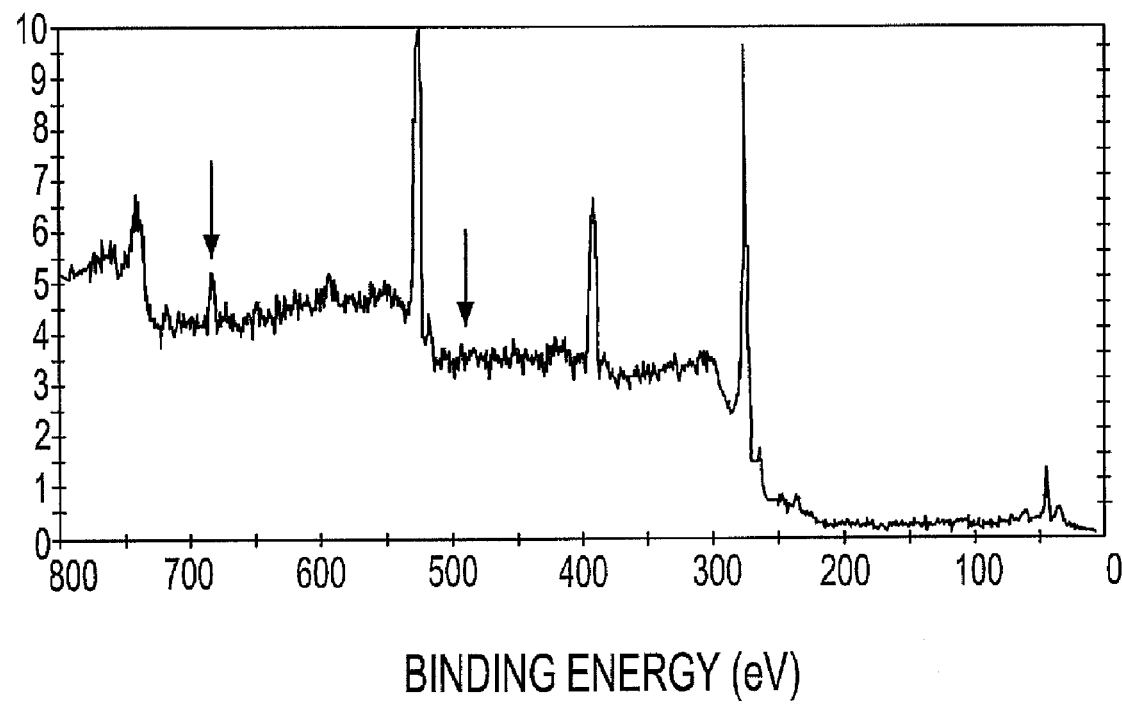
FIG. 1b illustrates an XPS spectrum on the chip passivation layer surface treated with $N_2$ gas plasma.
Figure 2B:
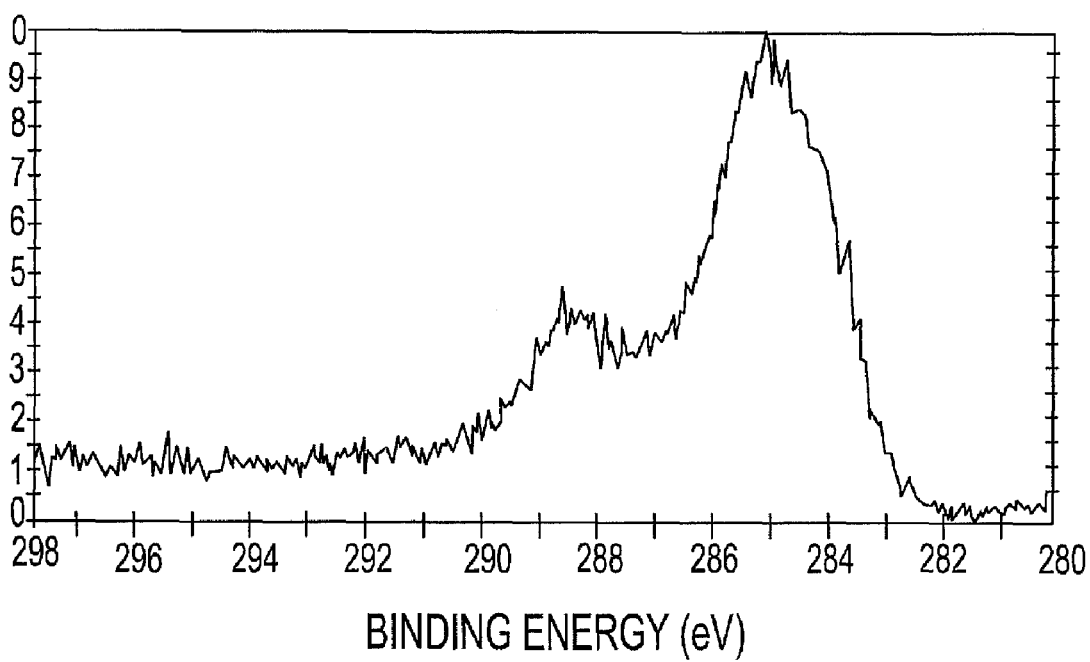
FIG. 2b illustrates a high-resolution C1s spectrum corresponding to FIG. 1b.

A chip with a graphitic and fluorinated layer was treated with $N_2$ plasma. FIG. 1b clearly demonstrates the XPS, which indicates a decrease of F; FIG. 2b represents the high-resolution spectrum of C1s clearly evidencing the disappearance of the graphitic layer after treatment with $N_2$ plasma under low-power and high-pressure conditions, as set forth hereinabove, i.e., at a power of about 100-200 W, and a high-pressure of about 500-750 mTorr. The $N_2$ plasma is employed in an etching process on the passivation layer, hereby etching the layer to a depth of about 1-100 nm, and preferably 5-20 nm.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method for removing contaminants that are produced during the positioning and soldering of Pb-free solderballs substantially comprising Sn onto a laminiate including graphitic and/or fluorinated organic layers from a surface of semiconductor chip passivation layer selected from the group of materials consisting of polyimide, PSBI and BCB, having Si-containing organic polymers while avoiding the creation of $SiO_2$ particles or SnOx/organotin, said method comprising subjecting said surface to a plasma etching process solely employing an $N_2$ plasma under a low-power within a range of about 100- to less than 200 W and a high-pressure within a range of about 500-750 mTorr; wherein said $N_2$ plasma etches the surface of said chip passivation layer to a depth of within about 1-20 nm, and implementing said $N_2$ plasma-etching process on semiconductor wafers which are subsequently processed to form a plurality of said chips.

* * * * *